United States Patent

Nam

Patent Number: 5,910,830
Date of Patent: Jun. 8, 1999

[54] LIQUID CRYSTAL DISPLAY PANELS INCLUDING ALIGNMENT KEYS IN THE ACTIVE REGIONS THEREOF, AND METHODS FOR MANUFACTURING

[75] Inventor: Hyo-Rak Nam, Kyungki-do, Rep. of Korea

[73] Assignee: Samsung Electronics Co., Ltd., Suwon, Rep. of Korea

[21] Appl. No.: 09/042,988

[22] Filed: Mar. 17, 1998

[30] Foreign Application Priority Data

Oct. 10, 1997 [KR] Rep. of Korea ................... 1997-51971

[51] Int. Cl.⁶ .................................................. G02F 1/1333
[52] U.S. Cl. .................................. 349/158; 349/43; 257/59
[58] Field of Search ......................... 349/158, 43; 257/59

[56] References Cited

U.S. PATENT DOCUMENTS 5,771,085  6/1998  Ochi et al. ............................... 349/158

OTHER PUBLICATIONS

O'Mara, "*Liquid Crystal Flat Panel Displays Manufacturing Science & Technology*", Van Nostrand Reinhold, 1993, pp. 160–162.

*Primary Examiner*—William L. Sikes
*Assistant Examiner*—Robert J. Hollingshead
*Attorney, Agent, or Firm*—Myers Bigel Sibley & Sajovec

[57] ABSTRACT

Liquid crystal display (LCD) panels include an array of active regions that include a plurality of stacked patterned layers, and alignment keys in the active regions for use in aligning the stacked patterned layers. The stacked patterned layers are preferably formed using a plurality of exposure shots, and the alignment keys are preferably located at the center of the exposure shots or are symmetrically located with respect to the center of the exposure shots. The array of active regions preferably includes an array of pixels and the alignment keys are in the array of pixels. In a preferred embodiment, the array of pixels include red, blue and green pixels and the alignment keys are in the red pixels. In another preferred embodiment, the alignment keys are located in a semitransparent layer or a transparent layer in the stacked patterned layers. For example, one of the stacked patterned layers is an amorphous silicon layer and the alignment keys are included in the stacked amorphous layer.

22 Claims, 10 Drawing Sheets

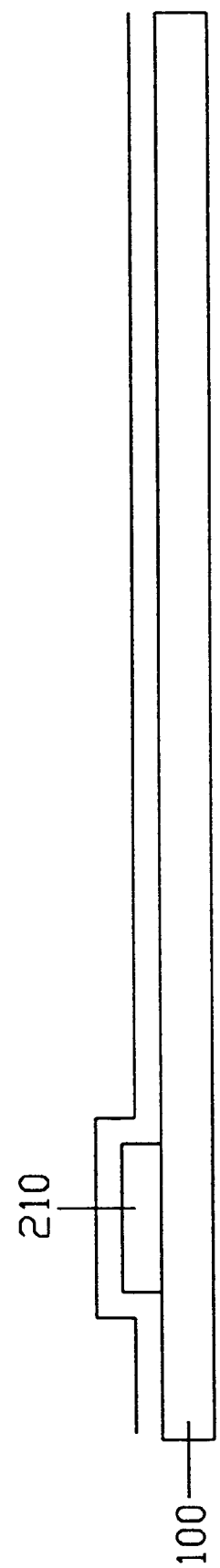

LIQUID CRYSTAL DISPLAY PANELS INCLUDING ALIGNMENT KEYS IN THE ACTIVE REGIONS THEREOF, AND METHODS FOR MANUFACTURING

FIELD OF THE INVENTION

This invention relates to liquid crystal display (LCD) panels and manufacturing methods therefor, and more particularly to alignment keys for LCD panels and methods of manufacturing LCD panels using alignment keys.

BACKGROUND OF THE INVENTION

LCD panels are widely used flat panel display devices. LCD panels are generally manufactured using microelectronic manufacturing techniques that are also used to manufacture integrated circuits.

In manufacturing LCD panels and integrated circuits, photolithography is generally used to pattern layers that are stacked on a substrate to form the LCD panel or integrated circuit. Masks are used to define the patterns. In order to produce high performance, high-quality devices, it is generally important that a succeeding mask layer is aligned to the pattern of a preceding mask layer. Alignment keys, also referred to as alignment marks, are often used to facilitate this alignment.

FIGS. 1A and 1B illustrate the use of alignment marks in integrated circuit manufacturing. As shown in FIG. 1A, an integrated circuit wafer 1 includes an array of spaced apart dies 2, which are the active regions that form integrated circuits. A scribing line 3 is used to divide the wafer into individual dies in the spaces between the dies. As shown in FIG. 1B, one or more alignment keys 4 are generally arranged in the space between dies. Although the alignment keys are indicated as being an "x", other shapes may be used. Subsequent masks are aligned to the wafer using the alignment keys 4.

A mask may be aligned to a wafer using the alignment keys 4 by first aligning the mask to a fiducial mark on a stepper. A midpoint or origin (0, 0) in the wafer is then found. This step is referred to as Wafer Global Alignment (WGA). A position of each exposure shot for the origin (0, 0) is obtained using the alignment keys 4 that are positioned in the space between the dies 2. The position of the alignment key for the origin point (0, 0) is set by the design. Errors between position values in the design and actual values obtained as described above, are checked. The wafer and the mask are then exposed after compensating for the error.

As shown in FIG. 1B, the alignment keys that are positioned in the spaces between integrated circuits are generally symmetrically arranged about a midpoint. Then, the positions of the alignment keys may be obtained by obtaining the positions of the alignment keys for the midpoint and averaging them.

As noted above, alignment keys are also used in manufacturing LCD panels. Conventional alignment in LCD panels will be described in connection with FIGS. 2A–2B and 3A–3B, which illustrate shot maps on the LCD panel. As used herein, a shot is defined as a region exposed on an LCD panel by a single radiation exposure. Reference number 5 indicates the alignment keys. It will be understood that although the alignment keys are shown in the form of an "x", different shapes of alignment keys may also be used.

FIGS. 2A and 2B illustrate shot maps when one mask per layer is used in manufacturing the LCD panel. The regions formed by dotted lines indicate shots exposed on the LCD panel in FIG. 2A. FIG. 2B illustrates a mask that may be used to form the LCD panel of FIG. 2A. As shown in FIGS. 2A and 2B, an A shot, a B shot and a C shot are repeatedly formed in the LCD panel of FIG. 2A, with the patterns for the A shot, the B shot and the C shot being formed in the mask of FIG. 2B. As shown, the A shot indicates an active region of an LCD panel, which is used as the display region.

Accordingly, the A shot on the LCD panel is aligned using the alignment keys inserted in the marginal areas of the B shot and C shot. Stated differently, the position for the A shot is obtained using the alignment keys in the B shot and the C shot. Unfortunately, this may degrade the alignment, since the position of the A shot is obtained indirectly using the alignment key in the B shot and in the C shot, rather than using an alignment key in the A shot.

FIGS. 3A and 3B illustrate shot maps when four masks per layer are used. FIG. 3A illustrates the shots exposed on the LCD panel and FIG. 3B illustrates the masks used when forming the LCD panel of FIG. 3A. As shown, the active region in the A shot may be aligned more accurately than in the LCD panel of FIG. 2, since the LCD panel may be aligned using an alignment key in the A shot. However, the region in which the alignment key can be inserted is generally limited to two sides. In particular, as shown in FIG. 3A, alignment keys may be placed in an upper side and left side of an A shot, in the upper side and right side of the B shot, in the lower side and left side of the C shot, and in the lower side and right side of the B shot. Accordingly, it may be difficult to uniformly arrange alignment keys in the shots so that it may be difficult to obtain the high degree of alignment accuracy that may be conventionally obtained in manufacturing integrated circuit devices.

In summary, it may be more difficult to obtain accurate alignment in fabricating LCD panels. More specifically, it may be difficult to obtain accurate alignment between the gate lines, data lines and pixel electrodes. This may degrade the performance and/or reliability of the LCD panel.

SUMMARY OF THE INVENTION

It is therefore an object of the present invention to provide improved liquid crystal display (LCD) panels and manufacturing methods therefor.

It is another object of the present invention to provide improved alignment keys for LCD panels and methods of using alignment keys to provide alignment between layers in LCD panels.

These and other objects are provided according to the present invention, by LCD panels that include an array of active regions that include a plurality of stacked patterned layers, and alignment keys in the active regions for use in aligning the stacked patterned layers. The stacked patterned layers are preferably formed using a plurality of exposure shots, and the alignment keys are preferably located at the center of the exposure shots or are symmetrically located with respect to the center of the exposure shots. The array of active regions preferably includes an array of pixels and the alignment keys are in the array of pixels. In a preferred embodiment, the array of pixels include red, blue and green pixels and the alignment keys are in the red pixels.

In another preferred embodiment, the alignment keys are located in a semitransparent layer or a transparent layer in the stacked patterned layers. For example, one of the stacked patterned layers is an amorphous silicon layer and the alignment keys are included in the stacked amorphous layer.

According to another aspect of the present invention, LCD panels include an LCD panel substrate, a plurality of gate lines, data lines and pixel electrodes on the substrate and a plurality of alignment keys on the substrate that at least partially laterally overlap the pixel electrodes. Preferably, the pixel electrodes include red, blue and green pixel electrodes and the alignment keys at least partially overlap the red pixel electrodes. The LCD panels also preferably comprise a semitransparent layer or a transparent layer on the LCD panel substrate, and the alignment keys are included in the semitransparent layer or the transparent layer. In another embodiment, an amorphous silicon layer is included on the LCD panel substrate and the alignment keys are included in the amorphous silicon layer. The alignment keys preferably fully laterally overlap and are insulated from the pixel electrodes.

Accordingly, by forming the alignment keys in active regions (the pixel regions) of the LCD panel, improved alignment may be obtained, compared to conventional LCDs that form alignment marks between the active areas or in the connector areas of the panel. Improved performance and/or reliability may be obtained.

More specifically, LCD panels according to the present invention include an LCD panel substrate and a first (gate) layer comprising a plurality of gate lines and a plurality of gate electrodes on the substrate. A gate insulating layer is provided on the first layer. A semiconductor layer is provided on the gate insulating layer, adjacent the gate electrodes. A second (data) layer is provided on the semiconductor layer. The second layer includes a plurality of data lines that intersect the plurality of gate lines to define a plurality of pixel regions, and a plurality of source and drain electrodes adjacent the semiconductor layer. A passivation layer is provided on the second layer and a plurality of pixel electrodes are provided on the passivation layer. A plurality of alignment keys is included in the plurality of pixel regions.

In one embodiment, the alignment keys are included in the semiconductor layer. Preferably, the semiconductor layer comprises an undoped amorphous silicon layer and a doped amorphous silicon layer on the undoped amorphous silicon layer adjacent the source and drain electrodes. In this embodiment, the plurality of alignment keys are preferably provided in the undoped amorphous silicon layer. Alternatively, the alignment keys are included in the passivation layer. The alignment keys preferably at least partially laterally overlap the pixel electrodes and more preferably fully laterally overlap and are insulated from the pixel electrodes.

LCD panels may be manufactured, according to the present invention, by forming a gate pattern on a substrate, forming a gate insulating layer on the gate pattern, forming a semiconductor layer on the gate insulating layer and patterning the semiconductor layer to define a channel layer and an alignment key. A second layer is formed on the patterned semiconductor layer. The second layer is patterned using the alignment key to obtain alignment, to thereby define a data line and source and drain electrodes. A passivation layer is formed on the patterned second layer and a transparent conductive layer is formed on the passivation layer. The transparent conductive layer is also preferably patterned using the alignment key to obtain alignment, to thereby define a pixel electrode. The semiconductor layer preferably includes an undoped amorphous silicon layer and a doped amorphous silicon layer, and the alignment key is preferably formed by patterning the amorphous silicon layer.

BRIEF DESCRIPTION OF THE DRAWINGS

FIG. 7A–7D are cross-sectional views of LCD panels according to the present invention during intermediate fabrication steps.

DETAILED DESCRIPTION OF PREFERRED EMBODIMENTS

Figure 1A:
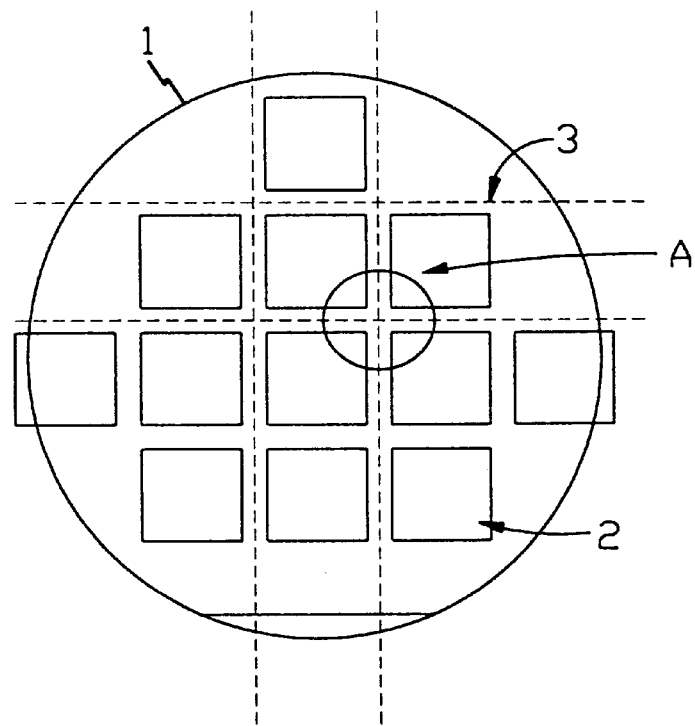
FIG. 1A is a top view of a conventional semiconductor wafer.
Figure 1B:
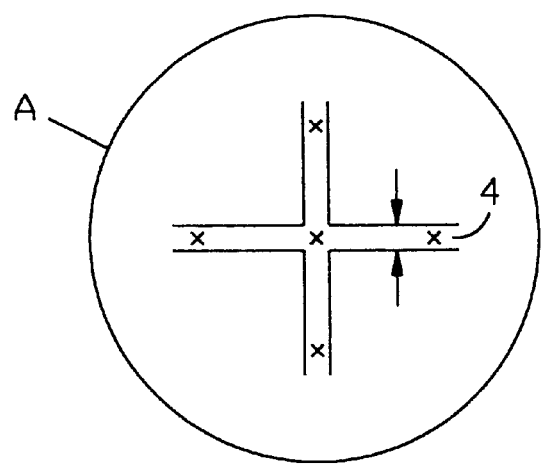
FIG. 1B is an enlarged view of portion A of FIG. 1A.
Figure 2A:
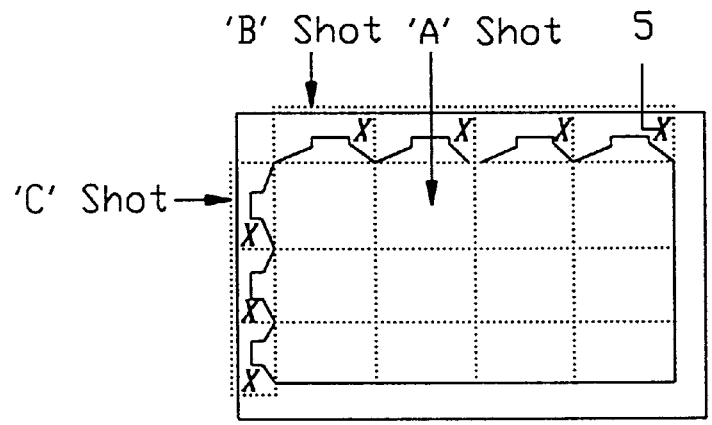
FIG. 2A is a view of conventional shots of an LCD panel that is manufactured using one mask per layer.
Figure 2B:
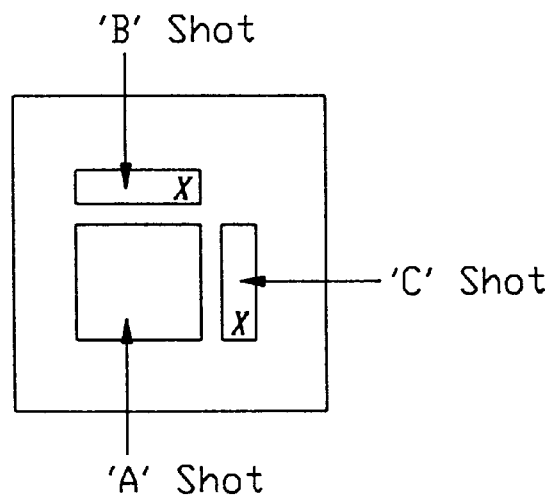
FIG. 2B is a view of mask used for forming the LCD panel of FIG. 2A.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 4A:
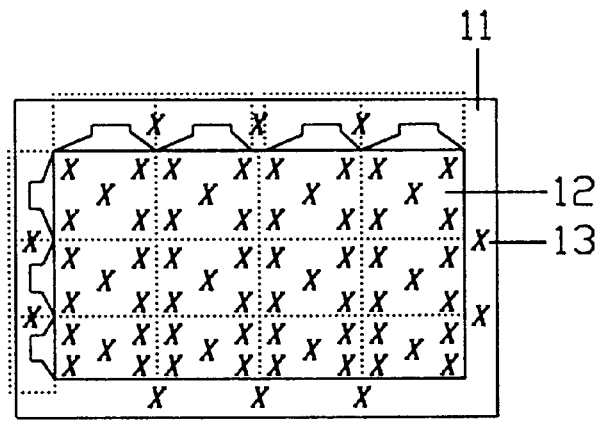
FIG. 4A is a layout view of alignment keys on LCD panels according to the present invention using one mask per layer.
Figure 4B:
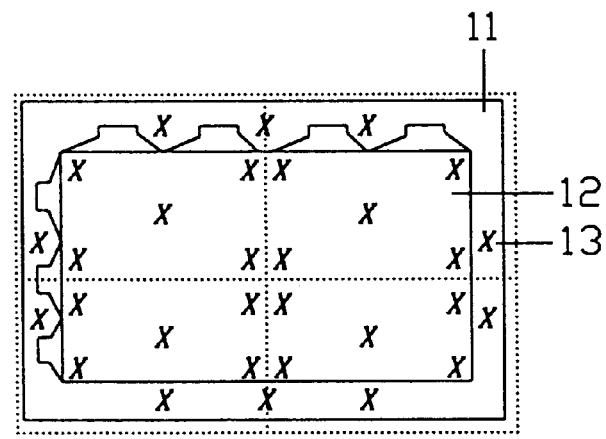
FIG. 4B is a view of alignment keys according to the present invention using four masks per layer.

Referring now to FIGS. 4A and 4B, arrangements of alignment keys on LCD panels according to the present invention will now be described. FIG. 4A illustrates alignment keys for LCD panels using one mask per layer and FIG. 4B illustrates alignment keys for LCD panels using four masks per layer. As shown in FIGS. 4A and 4B, alignment keys 13 are arranged within active regions 12 of the LCD panel 11. They may be arranged outside the active regions as well. As also shown in FIGS. 4A and 4B, alignment keys 13 may be placed in the center of each shot (each region formed by dotted lines) and/or symmetrically arranged with respect to the center of each shot.

Accordingly, liquid crystal display panels according to the present invention include an array of active regions, the active regions comprising a plurality of stacked patterned layers. Alignment keys are included in the active regions for use in aligning the stacked patterned layers. The stacked patterned layers are preferably formed using a plurality of exposure shots, and the alignment keys are located at the center of the exposure shots, are symmetrically located with respect to the center of the exposure shots or both.

The alignment keys of FIGS. 4A and 4B may be used to align the stacked patterned layers of an LCD panel by first aligning a mask to a fiducial mask on a stepper, to roughly determine a midpoint (0, 0) of the LCD panel. This is referred to as Plate Global Alignment (PGA). Positions of the shots for the midpoint (0, 0) obtained in the PGA are obtained using the alignment keys positioned within the active regions of the LCD panel. Errors between the values obtained above and design values of the alignment keys are checked. These errors are compensated for and then the mask is exposed.

More specifically, the position of each alignment key with respect to the fiducial point, generally the midpoint, is set when designing the LCD panel. Then, the actual positions of the alignment keys are obtained by scanning the alignment keys positioned on the actual LCD panel, for example using a laser beam. The differences between the design positions of the alignment keys and the actual positions of the alignment keys are obtained. The differences between the design position values and the actual position values of the alignment keys are averaged, and the relative positions of the actual LCD panel for the design values of the LCD panel are obtained.

The relative positions of the actual LCD panel for the design positions of the LCD panel are obtained in the above-described manner, and the LCD panel and the mask are aligned. For example, the LCD panel and the mask can be exactly aligned by moving the LCD panel by minus one in an X-axis direction, since the aligned mask is located in a position moved by minus one in the X-axis direction for the design position if the LCD panel is located in a position moved by plus one in the X-axis direction for the design position.

Figure 3A:
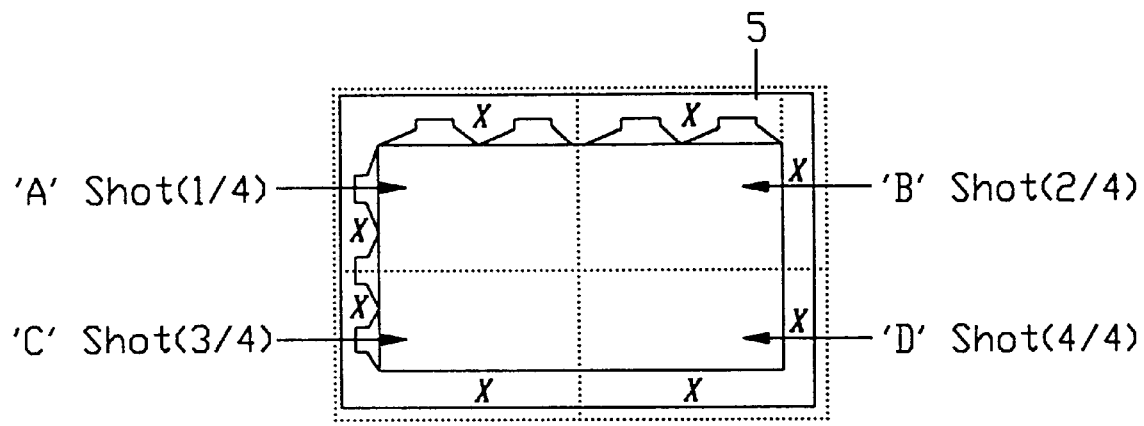
FIG. 3A is a view of conventional shots of an LCD panel that is manufactured using four masks per layer.
Figure 3B:
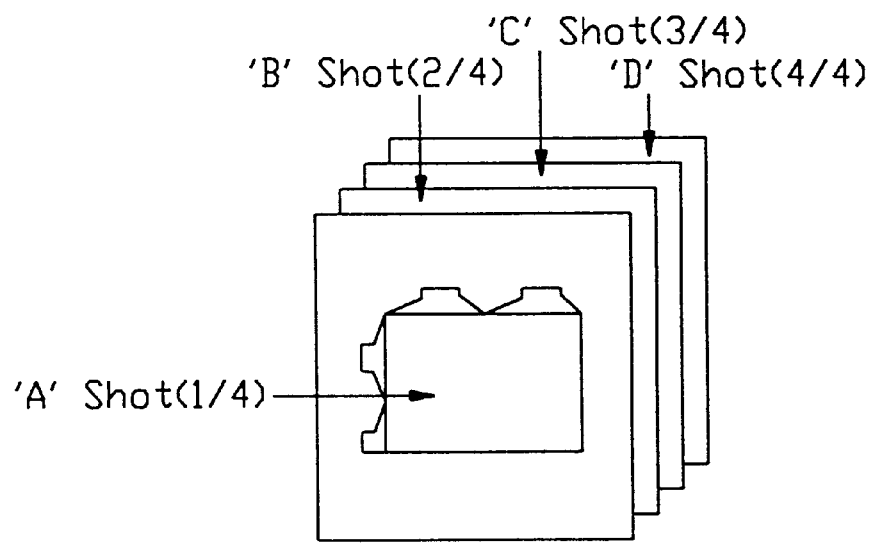
FIG. 3B is a view of the masks used for forming the LCD panel of FIG. 3A.

The position of each alignment key for the midpoint is obtained using the alignment keys arranged within the active regions in the LCD panel when obtaining the position of the LCD panel. The position of the LCD panel for the design position is obtained considering the position values generally. Accordingly, a more accurate position of the LCD panel can be obtained compared to a conventional technique illustrated in FIGS. 3A and 3B. It will be understood that although the alignment marks are indicated as being in the shape of an "x", other shapes may be used.

Figure 5:
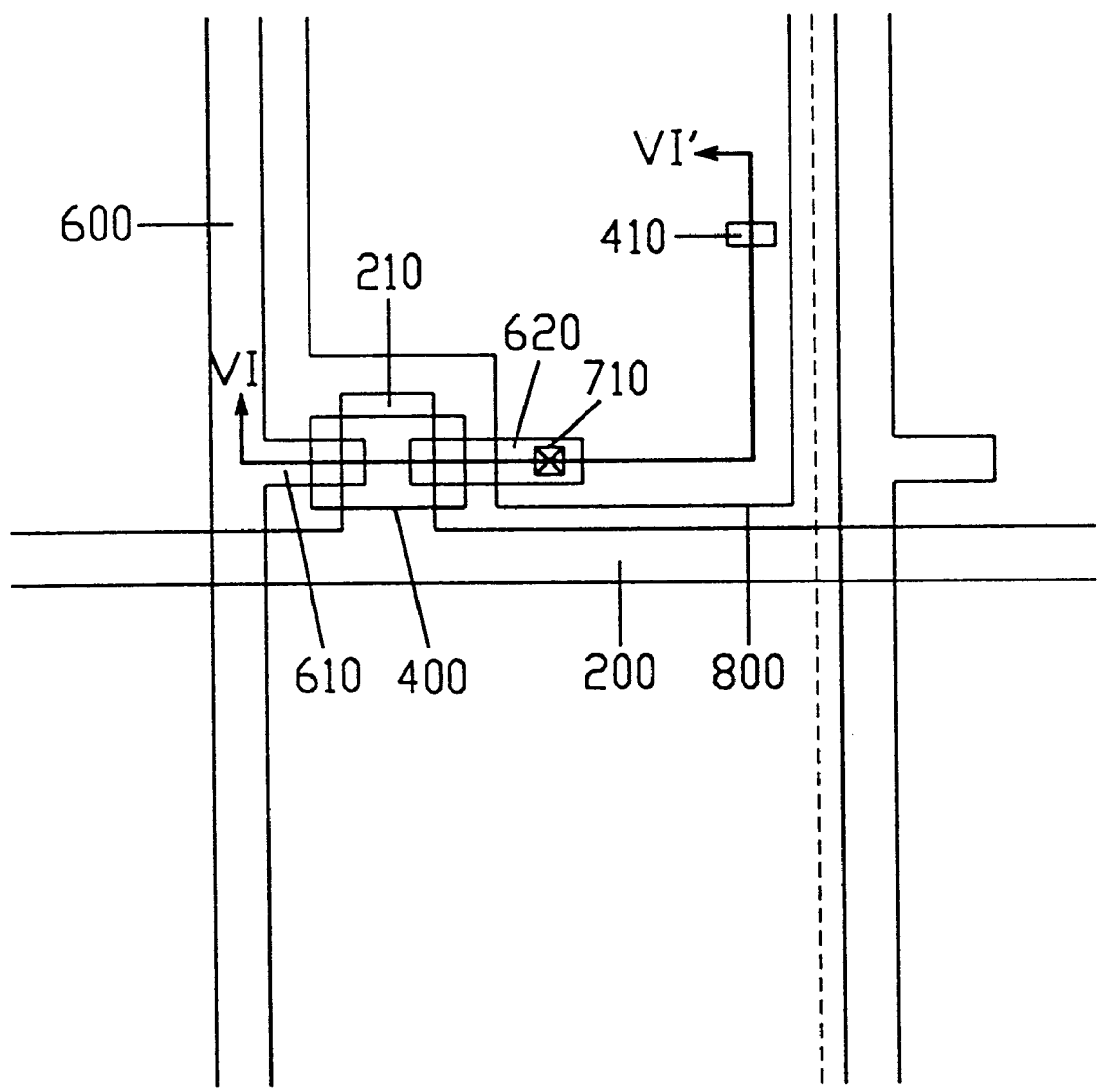
FIG. 5 is a top view of one example of an alignment key on LCD panels according to the present invention.
Figure 6:
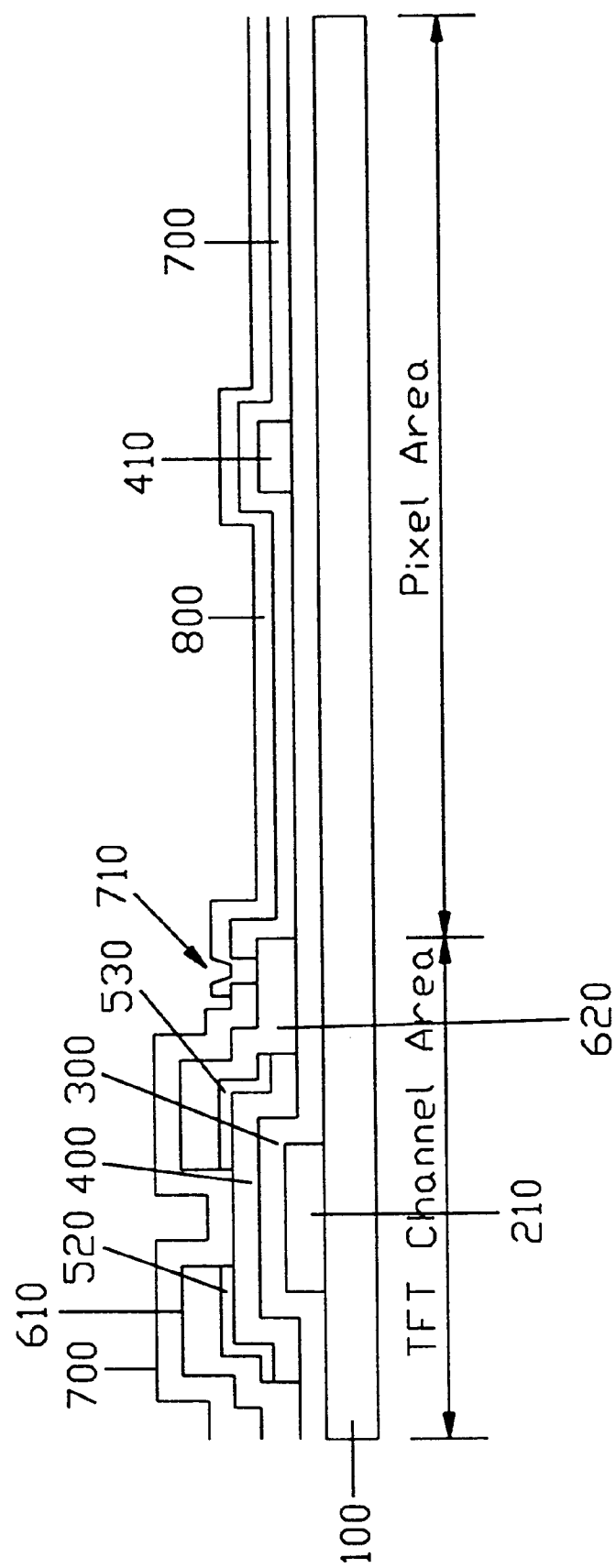
FIG. 6 is a cross-sectional view taken along the line VI–VI' in FIG. 5.

Referring now to FIGS. 5 and 6, LCD panels having alignment keys according to the present invention will be described. As shown in FIGS. 5 and 6, a first layer (gate pattern) including a gate line 200 and a gate electrode 210 branching therefrom, is formed on a substrate 100. A gate insulating layer 300 is provided on the gate pattern 200 and 210. An undoped amorphous silicon layer 400 and doped amorphous silicon layers 520 and 530 which are doped with a high density n+ type impurity, are included on the gate insulating layer 300 overlapping the gate electrode 210. An alignment key 410 of the undoped amorphous silicon is also included on the pixel region. Here, the undoped amorphous silicon layer 400 forms a channel layer. The channel layer forms a channel when a voltage is applied to the gate electrode 210. The alignment keys are preferably small in size since transmittance of light may be reduced due to the alignment keys formed on the pixel electrode.

A second layer (data pattern) is provided on the gate insulating layer 300. The second layer includes a data line 600, longitudinally extending on the gate insulating layer 300. A source electrode 610, branching from the data line 600, is provided on the doped amorphous silicon layer 520. A drain electrode 620 is provided on the doped amorphous silicon layer 530 opposite the source electrode 610.

A passivation film 700 is provided on the data pattern 600, 610 and 620, on the alignment key 410, and on the amorphous silicon layer 400 which is not covered by the data pattern. A contact hole 710 for exposing the drain electrode 620 is included in the passivation film 700. A pixel electrode 800, which is connected to the drain electrode 620 through the contact hole 710 and is made of indium tin oxide (ITO), is included on the passivation film 700.

The alignment key 410 is included in the pixel region at least partially laterally overlapping the pixel electrode 800 in a preferred embodiment of the present invention. However, the alignment key 410 may be located elsewhere other than the pixel region and may be made of material other than the amorphous silicon. In addition, an alignment key need not be included in every pixel. It is preferable that the alignment key 410 is included in a red pixel among the red, green and blue pixels, since the alignment key made of amorphous silicon is tinged with red in a preferred embodiment of the present invention. Alternatively, the alignment key 410 is located in an optional position wherein the alignment key 410 is formed in the passivation layer rather than the amorphous silicon layer.

Figure 7B:
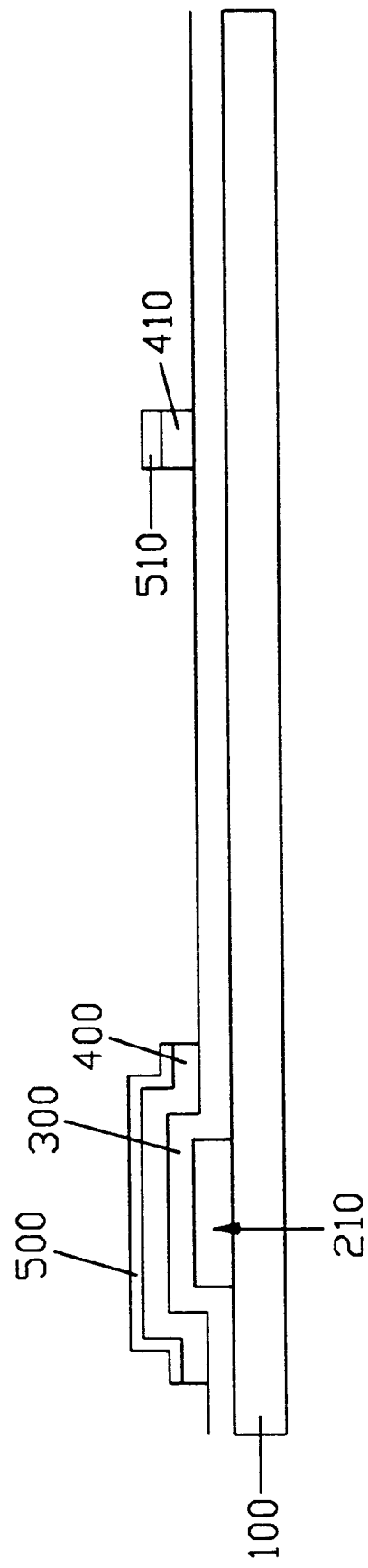
Figure 7C:
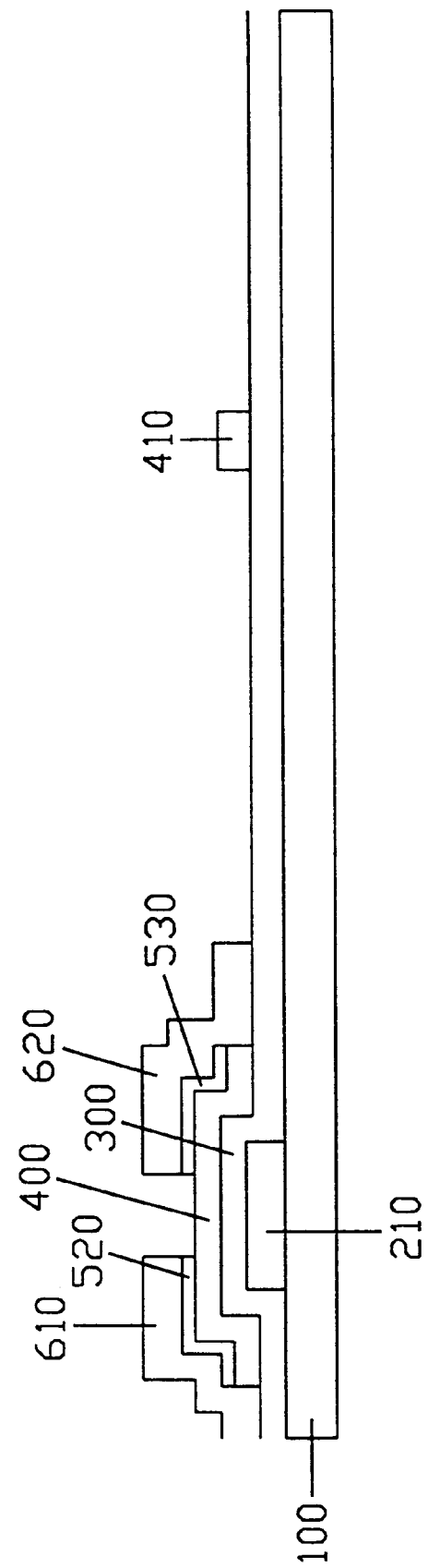

A method for manufacturing an alignment key illustrated in FIGS. 5 and 6 will now be described in detail with reference to FIGS. 7A to 7D. As illustrated in FIG. 7A, a first layer (gate pattern) including the gate line 200 and the gate electrode 210 is formed on the transparent substrate 100.

As illustrated in FIG. 7B, a gate insulation layer 300 comprising silicon nitride, an undoped amorphous silicon layer and a doped amorphous silicon layer are sequentially deposited. The doped amorphous silicon layer and the undoped amorphous silicon layer are etched through photolithography to form the amorphous silicon layer 400 and the doped amorphous silicon layer 500 thereon in a position corresponding to the gate electrode 210. The alignment key 410 and the doped amorphous silicon layer 520 thereon are also formed in the pixel region. The LCD panel and the mask are precisely aligned using the alignment key 410 formed by the amorphous silicon layer as described above, thereby forming a series of patterns on the LCD panel.

More specifically, a second conductive (metal) layer is deposited to form the data pattern, and a photoresist film is coated. The LCD panel and the mask are aligned using the alignment key on the LCD panel and the alignment key on the mask, and are exposed to radiation. After developing the photoresist film, the metal layer is etched, using the developed photoresist film as the mask, to form the data pattern including the data line 600, the source electrode 610 and the drain electrode 620. Next, the exposed and doped amorphous silicon layer 500 is removed using the data pattern 600, 610 and 620 as the mask. Thus, the alignment key 410 is formed in amorphous silicon, and subsequent patterns may be formed on the LCD panel using the alignment key 410.

Figure 7D:
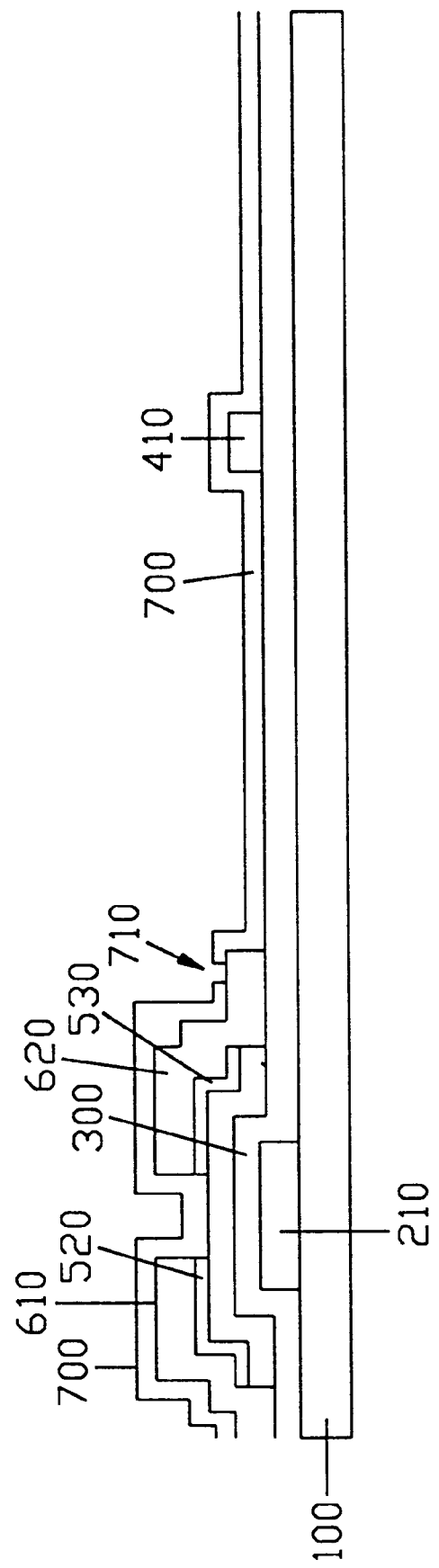

As illustrated in FIG. 7D, a contact hole 710 for exposing the drain electrode 620 is formed by etching the passivation layer 700, using the above-mentioned alignment method after depositing the ITO as illustrated in FIG. 6. Finally, the pixel electrode 800, which is connected to the drain electrode 620 through the contact hole 710, is formed by etching the ITO film using the above-described alignment method after depositing the ITO film as illustrated in FIG. 6.

As described above, the LCD panel and masks are aligned by forming an alignment key in the active region, preferably using amorphous silicon. The alignment key may be formed using doped amorphous silicon and/or a passivation film. Reduction of transmittance may be reduced by forming the alignment key in the active region, in a transparent layer or a semitransparent layer. Accordingly, production of defective LCD panels can be reduced by reducing the parasitic capacitance due to the misalignment of each layer, since the LCD panel and the masks can be precisely aligned using the alignment key formed in one light exposure region.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A liquid crystal display (LCD) panel comprising:
    an array of active regions, the active regions comprising a plurality of stacked patterned layers; and
    alignment keys in the active regions, for use in aligning the stacked patterned layers.

2. An LCD panel according to claim 1 wherein the stacked patterned layers are formed using a plurality of exposure shots, and wherein the alignment keys are located at the center of the exposure shots or are symmetrically located with respect to the center of the exposure shots.

3. An LCD panel according to claim 1 wherein the array of active regions include an array of pixels, and wherein the alignment keys are in the array of pixels.

4. An LCD panel according to claim 1 wherein the array of pixels include red, blue and green pixels, and wherein the alignment keys are in the red pixels.

5. An LCD panel according to claim 1 wherein one of the stacked patterned layers is a semitransparent layer or a transparent layer, and wherein the alignment keys are included in the one of the stacked patterned layers.

6. An LCD panel according to claim 1 wherein one of the stacked patterned layers is an amorphous silicon layer and wherein the alignment keys are included in the amorphous silicon layer.

7. An LCD panel according to claim 6 wherein the amorphous silicon layer is an undoped amorphous silicon layer.

8. A liquid crystal display (LCD) panel comprising:
    an LCD panel substrate;
    a plurality of gate lines, data lines and pixel electrodes on the substrate; and
    a plurality of alignment keys on the substrate that at least partially laterally overlap the pixel electrodes.

9. An LCD panel according to claim 8 wherein the pixel electrodes include red, blue and green pixel electrodes, and wherein the alignment keys at least partially overlap the red pixel electrodes.

10. An LCD panel according to claim 8 further comprising a semitransparent layer or a transparent layer on the LCD panel substrate, and wherein the alignment keys are included in the semitransparent layer or the transparent layer.

11. An LCD panel according to claim 8 further comprising an amorphous silicon layer on the LCD panel substrate, and wherein the alignment keys are included in the amorphous silicon layer.

12. An LCD panel according to claim 11 wherein the amorphous silicon layer is an undoped amorphous silicon layer.

13. An LCD panel according to claim 8 wherein the alignment keys fully laterally overlap and are insulated from, the pixel electrodes.

14. A liquid crystal display (LCD) panel comprising:
    an LCD panel substrate;
    a first layer comprising a plurality of gate lines and a plurality of gate electrodes on the substrate;
    a gate insulating layer on the first layer;
    a semiconductor layer on the gate insulating layer, adjacent the gate electrodes;
    a second layer on the semiconductor layer including a plurality of data lines that intersect the plurality of gate lines to define a plurality of pixel regions, and a plurality of source and drain electrodes adjacent the semiconductor layer;
    a passivation layer on the second layer;
    a plurality of pixel electrodes on the passivation layer; and
    a plurality of alignment keys in the plurality of pixel regions.

15. An LCD panel according to claim 14 wherein the alignment keys are included in the semiconductor layer.

16. An LCD panel according to claim 15 wherein the semiconductor layer comprises:
    an undoped amorphous silicon layer; and
    a doped amorphous silicon layer on the undoped amorphous silicon layer, adjacent the source and drain electrodes; and
    wherein the plurality of alignment keys are included in the undoped amorphous silicon layer.

17. An LCD panel according to claim 14 wherein the alignment keys are included in the passivation layer.

18. An LCD panel according to claim 14 wherein the alignment keys at least partially laterally overlap the pixel electrodes.

19. An LCD panel according to claim 18 wherein the alignment keys fully laterally overlap and are insulated from, the pixel electrodes.

20. A method of manufacturing a liquid crystal display (LCD) panel comprising the steps of:
    forming a gate pattern on a substrate;
    forming a gate insulating layer on the gate pattern;
    forming a semiconductor layer on the gate insulating layer;
    patterning the semiconductor layer to define a channel layer and an alignment key;
    forming a second layer on the patterned semiconductor layer;
    patterning the second layer using the alignment key to obtain alignment, to thereby define a data line and source and drain electrodes;
    forming a passivation layer on the patterned second layer; and
    forming a transparent conductive layer on the passivation layer.

21. A method according to claim 20 further comprising the step of patterning the transparent conductive layer using the alignment key to obtain alignment, to thereby define a pixel electrode.

22. A method according to claim 20:
    wherein the step of forming a semiconductor layer comprises the steps of:
    forming an undoped amorphous silicon layer on the gate insulating layer; and
    forming a doped amorphous silicon layer on the undoped amorphous silicon layer; and
    wherein the step of patterning the semiconductor layer comprises the step of patterning the undoped amorphous silicon layer to define an alignment key.

* * * * *